United States Patent
Hong

[11] Patent Number: 5,940,720
[45] Date of Patent: Aug. 17, 1999

[54] METHODS OF FORMING OXIDE ISOLATION REGIONS FOR INTEGRATED CIRCUITS SUBSTRATES USING MASK AND SPACER

[75] Inventor: Jun-Pyo Hong, Kyungki-do, Rep. of Korea

[73] Assignee: Samsung Electronics Co., Ltd., Rep. of Korea

[21] Appl. No.: 08/920,491

[22] Filed: Aug. 29, 1997

[51] Int. Cl.⁶ .......................... H01L 21/76; H01L 21/762
[52] U.S. Cl. ............................................. 438/445; 438/444
[58] Field of Search .................................. 438/444, 445, 438/446

[56] References Cited

U.S. PATENT DOCUMENTS

| | | | |
|---|---|---|---|
| 5,397,733 | 3/1995 | Jang | 437/69 |
| 5,629,230 | 5/1997 | Fazan et al. | 438/446 |
| 5,679,599 | 10/1997 | Mehta | 438/425 |

OTHER PUBLICATIONS

Stanley Wolf, Silicon Processing for the VLSI Era, vol. 1: Process Technology, Lattice Press, pp. 529 and 530, 1986.

*Primary Examiner*—Olik Chaudhuri
*Assistant Examiner*—Daniel H. Mao
*Attorney, Agent, or Firm*—Myers Bigel Sibley & Sajovec

[57] ABSTRACT

Oxide isolation regions are fabricated for integrated circuit substrates by forming a pad layer on an integrated circuit substrate and forming a silicon nitride mask on the pad layer. The mask exposes a portion of the pad layer. The exposed portion of the pad layer is thinned to thereby define a pad layer sidewall. A silicon nitride layer is formed on the silicon nitride mask, on the thinned pad layer and on the pad layer sidewall. The silicon nitride layer is selectively etched to form a silicon nitride spacer on the pad layer sidewall. The integrated circuit substrate is then oxidized, using the silicon nitride mask and the silicon nitride spacer as an oxidation mask, to thereby form an oxide isolation region in the thinned portion of the pad layer and in the integrated circuit substrate beneath the pad layer.

15 Claims, 4 Drawing Sheets

METHODS OF FORMING OXIDE ISOLATION REGIONS FOR INTEGRATED CIRCUITS SUBSTRATES USING MASK AND SPACER

FIELD OF THE INVENTION

This invention relates to integrated circuit fabrication methods and more particularly to methods of fabricating oxide isolation regions for integrated circuits.

BACKGROUND OF THE INVENTION

Integrated circuit devices include large numbers of microelectronic devices such as transistors, diodes, capacitors, and resistors in an integrated circuit substrate. It is important to electrically isolate these devices from one another in the integrated circuit substrate. Moreover, as the integration density of integrated circuit devices continues to increase, it becomes desirable to form narrow isolation regions which do not occupy excessive integrated circuit area while still effectively isolating adjacent devices.

One well known method for forming isolation regions for an integrated circuit substrate is LOCal Oxidation of Silicon (LOCOS). The LOCOS method uses local oxidation of a silicon integrated circuit substrate to form oxide isolation regions for the substrate.

FIGS. 1A–1C are cross-sectional views illustrating a conventional LOCOS method. As shown in FIG. 1A, a silicon oxide layer of about 500 Å in thickness is formed on an integrated circuit substrate such as a silicon substrate 11 by thermal oxidation. This silicon oxide layer 12 is referred to as a "pad layer." A silicon nitride layer 13 of about 1000 Å in thickness is deposited on the pad layer, for example by chemical vapor deposition. The pad layer 12 can be used to release stresses between the silicon nitride layer 13 and the silicon substrate 11.

Then, as shown in FIG. 1B, the silicon nitride layer 13 is patterned, for example using photolithography, so that a patterned silicon nitride layer 13a remains on an active region 19 of the silicon substrate 11 where microelectronic devices are to be formed. Accordingly, the pad oxide layer 12 is exposed in the areas where isolation regions are to be formed.

Referring now to FIG. 1C, the silicon substrate 11 is thermally oxidized, for example, by heating in an oxygen atmosphere, using the patterned silicon nitride layer 13a as a mask. Isolation regions 14 of silicon dioxide having a thickness of about 5000 Å are thereby formed. Then, the silicon nitride mask 13a is removed and active devices are formed in the active region 19a which is surrounded by the isolation regions 14.

Unfortunately, as shown in FIG. 1C, when performing the LOCOS method, the oxidation of the silicon substrate proceeds not only in the vertical direction but also in the lateral direction beneath the silicon nitride mask 13a. Thus, well known "bird's beaks" 15 are formed which substantially encroach into the active region of the integrated circuit substrate. As the integration density of integrated circuit devices continues to increase, the bird's beak may consume proportionately larger amounts of the active region.

FIGS. 2A and 2B illustrate a LOCOS method which can reduce the size of the bird's beak. As shown in FIG. 2A, a silicon dioxide layer 22 is formed on a silicon substrate 21. A polysilicon layer 26 is then formed, for example, by chemical vapor deposition, on the silicon dioxide layer 22. A silicon nitride layer 23 is then formed on polysilicon layer 26.

Referring now to FIG. 2B, the silicon nitride layer 23 is patterned to form a silicon nitride mask 23a. Then, the polysilicon layer 26 and the silicon substrate 21 are thermally oxided using the patterned silicon nitride layer 23a as a mask, to thereby form isolation regions 24 of silicon dioxide.

Unfortunately, as shown in FIG. 2B, bird's beaks 25 are also generally formed using this method. However, the bird's beaks 25 may be considerably smaller than the bird's beak 15 of FIG. 1C. In order to further suppress the growth of bird's beaks 25, it may be preferred to form a thick polysilicon layer 26. However, if polysilicon layer 26 is made too thick, projections 27 of the isolation regions 24 may be formed adjacent the bird's beaks 25. These projections may have an undesired effect upon subsequent integrated circuit processing. For example, concave regions may be formed between the projections 27 and the bird's beaks 25 thereby degrading device performance.

SUMMARY OF THE INVENTION

It is therefore an object of the present invention to provide improved methods of forming isolation regions for integrated circuit substrates.

It is another object of the present invention to perform oxide isolating methods for integrated circuit substrates which can reduce and preferably eliminate the formation of bird's beaks.

It is yet another object of the present invention to provide methods of forming isolation regions for integrated circuit substrates which can reduce bird's beaks without creating other undesired problems.

These and other objects are provided, according to the present invention, by forming mask extensions which extend from a mask on a pad layer towards the integrated circuit substrate, partially through the exposed portion of the pad layer, and oxiding the integrated circuit substrate using the mask and mask extensions as an oxidation mask. Isolation regions are thereby formed in the exposed portion of the pad layer and in the integrated circuit substrate beneath the exposed portion of the pad layer. The oxide isolation regions have reduced, if any, bird's beaks.

In particular, according to the present invention, oxide isolation regions are formed for integrated circuit substrates by forming a pad layer on the integrated circuit substrate and forming a mask on the pad layer. The mask exposes a portion of the pad layer. The exposed portion of the pad layer is then thinned to thereby define a pad layer sidewall. The integrated circuit substrate is then oxidized, using the mask and the spacer as an oxidation mask, to thereby form an oxide isolation region in the thinned portion of the pad layer and in the integrated circuit substrate beneath the thinned pad layer.

When thinning the exposed portion of the pad layer, about two-thirds of the thickness of exposed portion of the pad layer may be removed. The pad layer preferably comprises silicon dioxide and the mask and the spacers preferably comprise silicon nitride. The mask is preferably formed by blanket forming a mask layer on the pad layer and then patterning the mask layer to form the mask. Thinning may be provided by isotopically edging the exposed portion of the pad layer which thereby undercuts the exposed portion of the pad layer as well.

An embodiment of the present invention forms a pad layer on an integrated circuit substrate and forms a silicon nitride mask on the pad layer. The mask exposes a portion of the pad layer. The exposed portion of the pad layer is then thinned to thereby define a pad layer sidewall. A silicon nitride layer is formed on the silicon nitride mask, on the thinned pad layer and on the pad layer sidewall. The silicon nitride layer is selectively etched to form a silicon nitride spacer on the pad layer sidewall. The integrated circuit substrate is then oxidized using the silicon nitride mask on the silicon nitride spacer as an oxidation mask, to thereby form an oxide isolation region in the thinned portion of the pad layer and in the integrated circuit substrate beneath the pad layer. The selective etching of the silicon nitride layer may be accomplished by dry etching the silicon nitride layer.

Accordingly, the silicon nitride sidewall spacers can prevent the diffusion of oxygen along the pad layer to thereby reduce the formation of bird's beaks. Moreover, since the silicon nitride layer is not directly in contact with the silicon substrate, it is possible to reduce stress between the silicon nitride and the silicon substrate.

DETAILED DESCRIPTION OF PREFERRED EMBODIMENTS

Figure 1A:
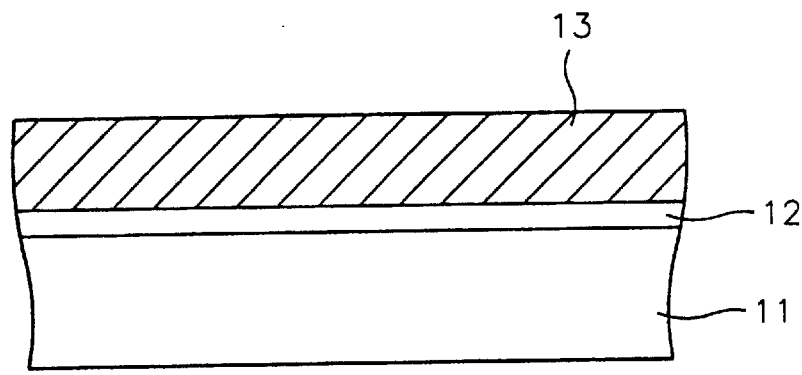
FIGS. 1A–1C are cross-sectional views of conventional methods of forming isolation regions using LOCOS.
Figure 1B:
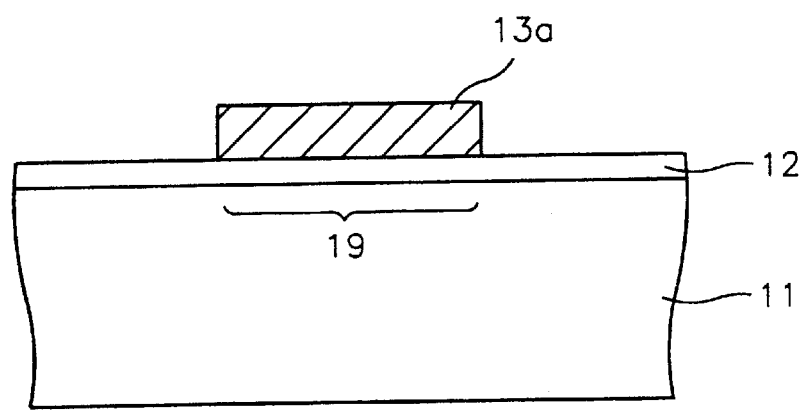
Figure 1C:
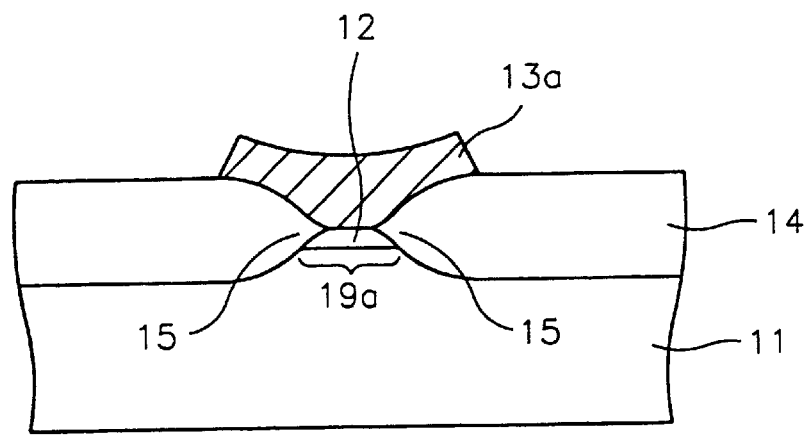

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will also be understood that when a layer is referred to as being "on" another layer or substrate, it can be directly on the other layer or substrate, or intervening layers may also be present.

Figure 3A:
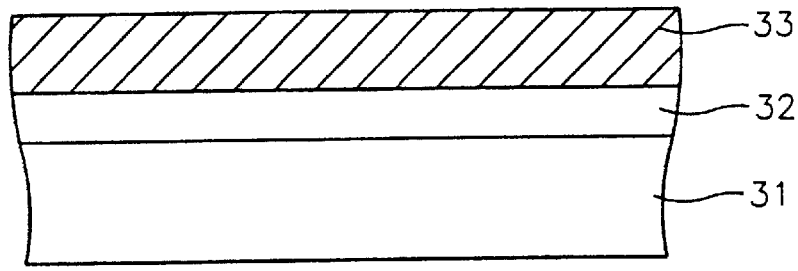
FIGS. 3A–3F are cross-sectional views illustrating steps of fabricating oxide isolation regions for integrated circuit substrates according to the present invention.

Referring now to FIGS. 3A–3F, methods of fabricating oxide isolation regions for integrated circuit substrates according to the invention will now be described. As shown in FIG. 3A, a pad layer 32 is formed on an integrated circuit substrate 31 such as a silicon substrate. The pad layer 32 may be formed by thermally oxidizing the integrated circuit substrate 31 at temperatures of about 950° C. to form a pad layer 32 between about 700 Å and 900 Å in thickness. A first silicon nitride layer 33 having a thickness between about 1350 Å and 1650 Å is deposited using chemical vapor deposition at about 780° C. It is preferred that the first silicon nitride layer 33 not be excessively thick so as not to create physical stress on the silicon substrate 31.

Figure 3B:
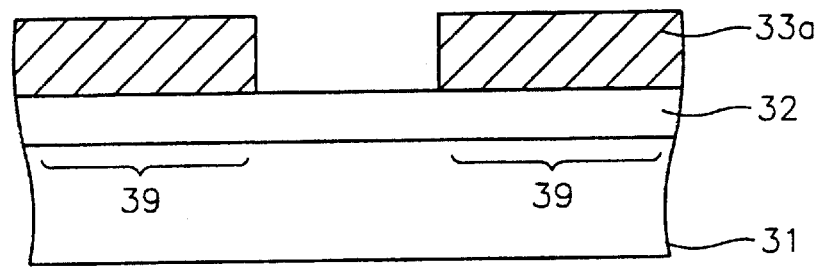

Referring now to FIG. 3B, first silicon nitride layer 33 is patterned using photolithography and etching to form a silicon nitride mask 33a on the pad layer 32. As shown, the mask 33a exposes a portion of the pad layer 32 where oxide isolation regions will be formed. The mask covers the active device regions 39 of the silicon substrate 31.

Figure 3C:
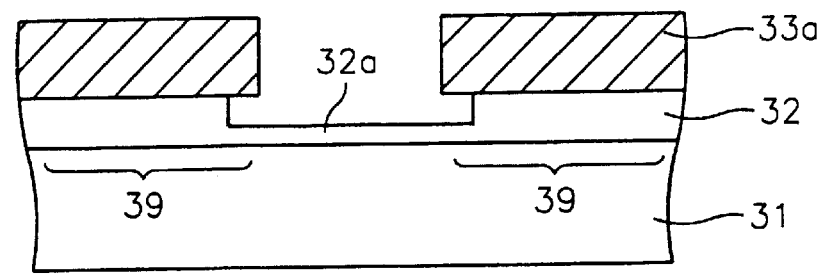

Referring now to FIG. 3C, the exposed portion of the pad layer is then thinned to define a pad layer sidewall. As shown in FIG. 3C, the thinning step comprises the step of removing about two-thirds of the thickness of the exposed portion of the pad layer so that only one-third of the exposed portion of the pad layer remains. The remaining pad layer is denoted by reference number 32a.

The thinning step may be performed by isotopically etching the pad layer 32 using silicon nitride mask 33a. The upper part of the exposed portion of pad layer 32 is removed and the lower part 32a remains. The lower part 32a has a thickness between about 220 Å and 280 Å. The isotropic etching may be performed by wet etching. As shown, the underlying silicon dioxide layer 32 is also partially removed in the lateral direction at the edges of the silicon nitride mask 33a. Thus, undercutting is provided.

Figure 3D:
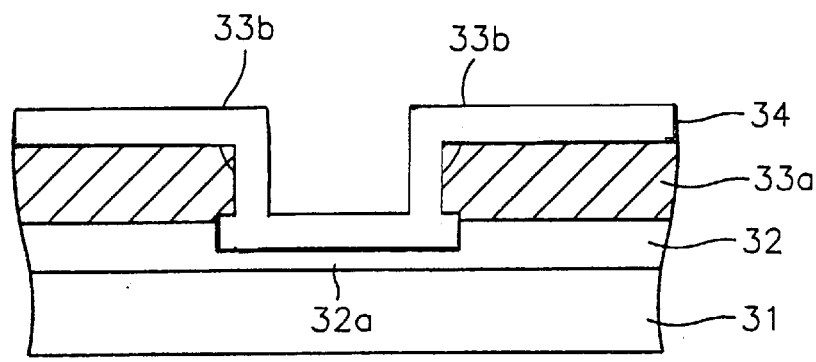

Referring now to FIG. 3D, a silicon nitride layer 34, between about 1000 Å and 1400 Å thick, is deposited on the silicon nitride mask 33a, on the thinned pad layer 32a, on the pad layer sidewall and on the sidewall 33b of the silicon nitride mask. The silicon nitride layer 34 may be deposited using chemical vapor deposition at about 780° C.

Figure 3E:
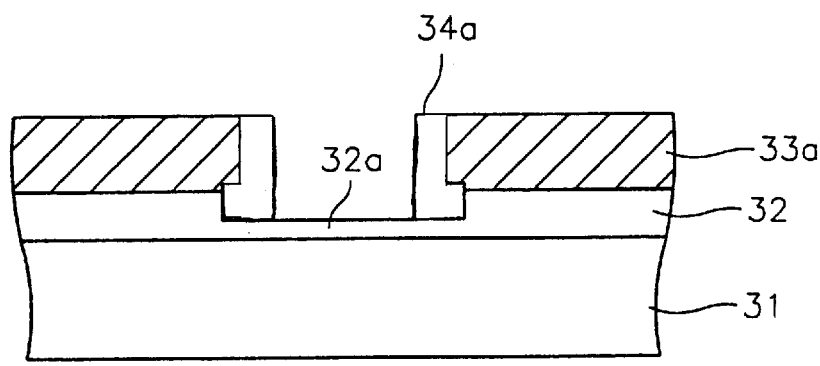

Referring now to FIG. 3E, the silicon nitride layer 34 is dry etched to form spacers 34a of silicon nitride on the pad layer sidewalls as well as on the silicon nitride mask sidewalls. The lower part 32a of the pad oxide layer 32 is exposed where the isolation region is to be formed, because the pad layer functions as an etch stop during the dry etching process. The spacers 34a can be used to reduce the size of the bird's beak in the subsequent thermal oxidation process.

Figure 3F:
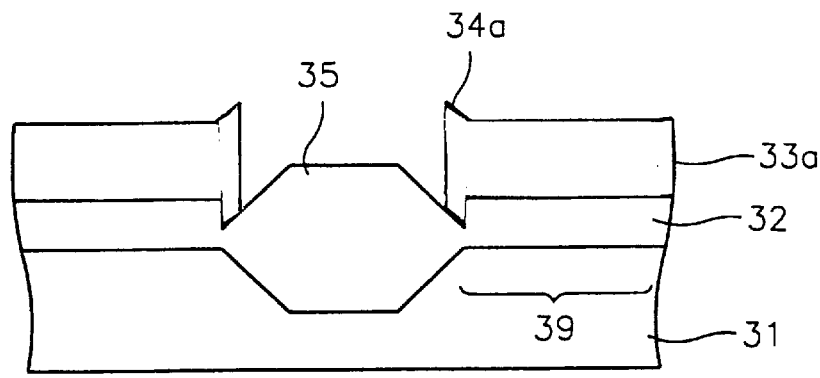

Finally, referring to FIG. 3F, the integrated circuit is thermally oxidized in an oxidizing atmosphere of about 950° C. using the silicon nitride mask 33 and the silicon nitride spacers 34a as an oxidation mask. An oxide isolation region 35 is thereby formed in the thinned portion 32a of the pad layer 32 and in the silicon substrate 31 beneath the thinned portion 32a of pad layer 32. The isolation region 36 preferably has a thickness between about 6500 Å and 7500 Å.

During the step of thermal oxidation, lower part 32a of the pad oxide layer 32 is oxidized and the oxidation reaction proceeds largely in the depth direction. Oxidation in the lateral direction is reduced and preferably suppressed by the silicon nitride spacers 34a. Accordingly, the spacers 34a may be regarded as a mask extension which extends from the mask 33a towards the integrated circuit substrate 31, partially through the exposed portion of the pad layer 32.

Figure 2A:
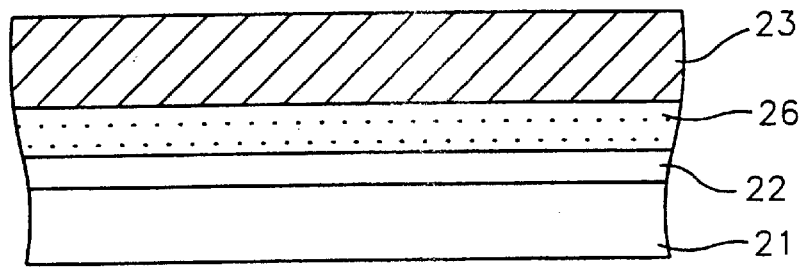
FIGS. 2A–2B are cross-sectional views illustrating a second example of conventional methods of forming isolation regions using LOCOS.
Figure 2B:
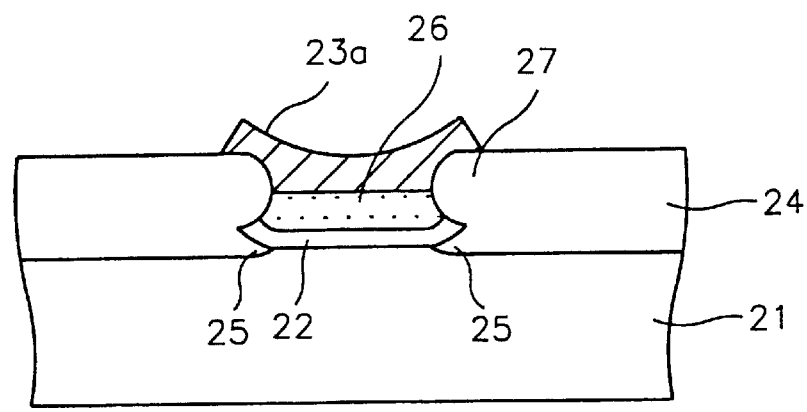

Comparing FIGS. 3F and 2B, it can be seen that abnormal protrusions of isolation regions 35 are not large compared to protrusions 27 of FIG. 2B. Among other reasons, this is because the lower portion 32a of the pad oxide layer 32 is about one-third the thickness of the remaining portion of the pad layer 32. Accordingly, the isolation regions formed according to the present invention can generate only small bird's beaks. Thus, as shown in FIG. 3F, the active regions 39 need not be encroached by the bird's beaks.

Finally, the silicon nitride mask 33a and the silicon nitride spacers 34a are removed. Active devices such as transistors, diodes, capacitors, resistors, etc. are formed in the active device regions 39.

Since sidewall spacers of silicon nitride are formed between the active device region and the device isolating regions, diffusion of oxygen can be reduced and preferably prevented along the pad oxide layer during thermal oxidation. Thus, the bird's beaks which are formed during thermal oxidation can be reduced. Accordingly, isolation regions can be formed while reducing and preferably suppressing the growth of bird's beaks. The integration density of integrated circuits can therefore be increased. Moreover, since the silicon nitride need not be in direct contact with the silicon substrate, stresses can be reduced. The thicker portions of the pad oxide can still provide stress relief, while the thinner portions can be used to reduce bird's beaks. Finally, since isolation regions having a desired thickness can be formed by thermal oxidation for a relatively short time, there is no need to make the patterns in the mask smaller in order to obtain small bird's beaks.

In the drawings and specification, there have been disclosed typical embodiments of the invention and, although specific terms are employed, they are used in a generic and descriptive sense only and not for purposes of limitation, the scope of the invention being set forth in the following claims.

That which is claimed:

1. A method of fabricating an oxide isolation region for an integrated circuit substrate, comprising the steps of:

forming a pad layer on the integrated circuit substrate;

forming a mask on the pad layer, the mask exposing a portion of the pad layer;

simultaneously thinning and undercutting the exposed portion of the pad layer to thereby define a pad layer sidewall that is undercut from the mask and a thinned portion of the pad layer;

forming a spacer on the pad layer sidewall; and oxidizing the integrated circuit substrate, using the mask and the spacer as an oxidation mask, to thereby form an oxide isolation region in the thinned portion of the pad layer and in the integrated circuit substrate beneath the thinned portion of the pad layer.

2. A method according to claim 1 wherein the thinning step comprises the step of removing about two thirds of the thickness of the exposed portion of the pad layer.

3. A method according to claim 1 wherein the integrated circuit substrate comprises silicon, wherein the pad layer comprises silicon dioxide and wherein the mask and the spacer comprise silicon nitride.

4. A method according to claim 1 wherein the mask forming step comprises the steps of:

blanket forming a mask layer on the pad layer; and patterning the mask layer to form the mask.

5. A method according to claim 1 wherein the thinning step comprises the step of isotopically etching the exposed portion of the pad layer.

6. A method according to claim 1 wherein the step of forming a spacer comprises the steps of:

forming a spacer layer on the mask, on the thinned pad layer and on the pad layer sidewall; and selectively etching the spacer layer to form the spacer.

7. A method according to claim 6 wherein the etching step comprises the step of dry etching the spacer layer.

8. A method according to claim 1 wherein the step of forming a pad layer comprises the step of thermally oxidizing the integrated circuit substrate.

9. A method of fabricating an oxide isolation region for an integrated circuit substrate, comprising the steps of:

forming a pad layer on the integrated circuit substrate;

forming a silicon nitride mask on the pad layer, the silicon nitride mask exposing a portion of the pad layer;

simultaneously thinning and undercutting the exposed portion of the pad layer to thereby define a pad layer sidewall that is undercut from the silicon nitride mask and a thinned portion of the pad layer;

forming a silicon nitride layer on the silicon nitride mask, on the thinned portion of the pad layer and on the pad layer sidewall;

selectively etching the silicon nitride layer to form a silicon nitride spacer on the pad layer sidewall; and oxidizing the integrated circuit substrate, using the silicon nitride mask and the silicon nitride spacer as an oxidation mask, to thereby form an oxide isolation region in the thinned portion of the pad layer and in the integrated circuit substrate beneath the pad layer.

10. A method according to claim 9 wherein the thinning step comprises the step of removing about two thirds of the thickness of the exposed portion of the pad layer.

11. A method according to claim 9 wherein the integrated circuit substrate comprises silicon and wherein the pad layer comprises silicon dioxide.

12. A method according to claim 9 wherein the silicon nitride mask forming step comprises the steps of:

blanket forming a silicon nitride layer on the pad layer; and patterning the silicon nitride layer to form the silicon nitride mask.

13. A method according to claim 9 wherein the thinning step comprises the step of isotopically etching the exposed portion of the pad layer.

14. A method according to claim 9 wherein the step of selectively etching comprises the step of dry etching the silicon nitride layer.

15. A method according to claim 9 wherein the step of forming a pad layer comprises the step of thermally oxidizing the integrated circuit substrate.

* * * * *